United States Patent
Moss

(10) Patent No.: US 9,172,228 B2
(45) Date of Patent: *Oct. 27, 2015

(54) ELECTRICAL FITTINGS WITH INTEGRAL COVER PLATE AND METHOD OF USE THEREOF

(71) Applicant: J Moss, Roswell, GA (US)

(72) Inventor: J Moss, Roswell, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/546,515

(22) Filed: Nov. 18, 2014

(65) Prior Publication Data

US 2015/0075835 A1    Mar. 19, 2015

Related U.S. Application Data

(63) Continuation of application No. 13/460,060, filed on Apr. 30, 2012, now Pat. No. 8,921,694.

(51) Int. Cl.
*H02G 3/16* (2006.01)
*H05K 5/00* (2006.01)
*H05K 13/04* (2006.01)
*H02G 3/14* (2006.01)
*H02G 3/08* (2006.01)
*H02G 3/10* (2006.01)
*H02G 3/12* (2006.01)

(52) U.S. Cl.
CPC . *H02G 3/14* (2013.01); *H02G 3/08* (2013.01); *H02G 3/081* (2013.01); *H02G 3/10* (2013.01); *H02G 3/16* (2013.01); *H02G 3/12* (2013.01); *H05K 5/00* (2013.01); *Y10T 29/49194* (2015.01)

(58) Field of Classification Search
CPC ........... H02G 3/08; H02G 3/16; H02G 3/086; H02G 3/081; H02G 3/12; H02G 3/14; H02G 3/10; H05K 5/00; H05K 5/02; H05K 5/03; H01R 13/46; H01R 13/506; H01R 13/50; H01R 13/58; H01R 13/5804; H01R 13/5812; Y10T 29/49194
USPC ............ 174/480, 481, 50, 53, 57, 58, 66, 67; 220/3.2–3.9, 241, 242; 439/535, 536, 439/449, 405, 392; 248/49, 68.1
See application file for complete search history.

(56) References Cited

U.S. PATENT DOCUMENTS

| | | | | |
|---|---|---|---|---|
| 3,860,739 A * | 1/1975 | Kloth et al. | ...................... | 174/58 |
| 4,165,443 A * | 8/1979 | Figart et al. | ...................... | 174/53 |
| 4,284,316 A * | 8/1981 | Debaigt | ........................ | 439/392 |
| 4,679,881 A * | 7/1987 | Galvin et al. | ................. | 439/392 |
| 4,842,551 A * | 6/1989 | Heimann | ........................ | 174/58 |
| 5,109,316 A * | 4/1992 | Murphy | .......................... | 174/58 |
| 5,980,303 A * | 11/1999 | Lee et al. | ...................... | 439/405 |
| 6,786,766 B1 * | 9/2004 | Chopra | .......................... | 439/535 |
| 6,939,179 B1 * | 9/2005 | Kieffer et al. | ................. | 439/650 |
| 7,052,313 B2 * | 5/2006 | Gorman | ......................... | 439/535 |
| 7,425,677 B2 * | 9/2008 | Gates et al. | ...................... | 174/50 |
| 7,497,273 B2 * | 3/2009 | Schoettle | ........................ | 173/53 |
| 8,058,552 B2 * | 11/2011 | Kruse et al. | ...................... | 174/53 |
| 8,921,694 B2 * | 12/2014 | Moss | ................................ | 174/53 |

* cited by examiner

*Primary Examiner* — Angel R Estrada
(74) *Attorney, Agent, or Firm* — Mathew L. Grell; Balser & Grell IP Law, LLC

(57) ABSTRACT

An electrical fitting that comprises an integral cover plate and an electrical component, such as an outlet or a switch, the combined electrical component/cover plate being secured via screws through the cover plate into a wall box. Wires are secured to power wires coming from the wall box via quick-connectors or wirenuts.

20 Claims, 4 Drawing Sheets

ELECTRICAL FITTINGS WITH INTEGRAL COVER PLATE AND METHOD OF USE THEREOF

CROSS-REFERENCE TO RELATED APPLICATIONS

To the full extent permitted by law, the present U.S. Nonprovisional Patent Application, is a Continuation of, and hereby claims priority to and the full benefit of U.S. Nonprovisional Application entitled "Electrical Fittings with Integral Cover Plate and Method of Use Thereof," having assigned Ser. No. 13/460,060, filed on Apr. 30, 2012, incorporated herein by reference in its entirety.

FEDERALLY SPONSORED RESEARCH OR DEVELOPMENT

None

PARTIES TO A JOINT RESEARCH AGREEMENT

None

REFERENCE TO A SEQUENCE LISTING

None

BACKGROUND OF THE INVENTION

1. Technical Field of the Invention

The present invention relates generally to electrical fittings or fixtures, and more specifically to electrical fittings or fixtures having an integral cover plate.

2. Description of Related Art

During construction of buildings, both commercial and residential, it is common to provide an electrical wall box for receiving an electrical fitting, such as, an outlet or a switch. The electrical wall box is typically secured to the side of a vertical stud. Once the wall box is installed, wallboard is typically installed over the studs and an opening is cut in the wallboard in order to pass the electrical fitting through the wallboard. Often, the opening is cut prior to installation of the wall box and the wall box is secured to align with the opening. Electrical wiring from a power source enters the wall box via an opening therein, wherein the electrical wiring is accessible from the front of the wall box.

To complete the installation of the electrical fitting, wires from the fitting are secured to corresponding wires in the wall box, such as, via wire nuts, and the fitting is secured, typically via screws that engage tubular openings (threaded or unthreaded—for self-tapping screws) in the wall box. Subsequently, a decorative cover plate is installed over the fitting, by securing the cover plate, such as, via screws that engage threaded openings in the fitting.

Whenever a building is undergoing renovation, the existing wall fittings and their cover plates are often in need of replacement or may simply need to be replaced to provide a different appearance. Further, it is often necessary to replace a single, defective fitting.

In order to replace such existing fittings, once the old cover plates and fittings are removed, typically a new fitting is installed by securing the wires of the new fitting to their corresponding wires in the wall box (step one), securing the fitting to the wall box (step two), and, subsequently, securing a new cover plate over the replaced fitting (step three). All of these steps are labor intensive, resulting in higher costs than would otherwise be incurred through a simpler apparatus and method of installation. Moreover, stock keeping units must be maintained for both the fittings and the cover plates, thereby increasing record-keeping costs for inventory.

When installing an electrical fitting to a wall box, the fitting has openings for fasteners to engage the wall box receiving apertures. Once the fitting is installed, the cover plate is secured via fasteners through different openings, thus requiring both different locations for the openings that receive the fasteners, but more importantly, a larger number of openings that should be required.

Therefore, it is readily apparent that there is a need for an electrical fitting and cover plate combination that reduces the typical three step installation to a wired wall box from three steps to two.

BRIEF SUMMARY OF THE INVENTION

Briefly described, in a preferred embodiment, the present invention overcomes the above-mentioned disadvantages and meets the recognized need for such a device by providing an electrical fitting, such as, for exemplary purposes only and without limitation, an electrical outlet or an electrical switch, wherein the electrical fitting comprises an integral cover plate, and wherein the composite electrical fitting/cover plate is secured via screws through the cover plate into the wall box, thereby reducing inventory for parts suppliers and labor costs for installation.

According to its major aspects and broadly stated, the present invention in its preferred form is a composite electrical fitting comprising an electrical component having an integrally-formed cover plate, the electrical component and cover plate comprising a single unit. The composite electrical fitting is dimensioned to be received by a wall box, the wall box having apertures dimensioned to cooperatively engage fasteners. The cover plate has one or more openings therein that are dimensioned to receive fasteners. Preferably, the composite electrical fitting is removably secured to the wall box via the fasteners.

The electrical component has integral wires, each having a first end and a second end, with the first end in electrical communication with the electrical component, and each wire of the electrical component has a quick-connect member disposed at the second end thereof. The quick-connect member comprises a gripping member dimensioned to secure an electrical conductor therewithin. The electrical conductor typically comprises a sheath therearound, and the quick-connect member has a cutting member dimensioned to pierce the sheath.

The electrical component may comprise an electrical outlet having one or more receptacles for receiving electrical plugs, and/or may comprise an electrical switch. Preferably, the electrical component comprises two receptacles. Alternatively, the electrical component comprises four receptacles.

In the course of either an initial installation or for remodelling, an electrical fitting/cover plate combination is obtained and each of its wires is secured to a corresponding wire coming out of the electrical wall box via the quick-connect member which pierces the insulating sheath of the wire coming from the wall box. Subsequently, the electrical fitting/cover plate combination is secured to the electrical wall box by passing one or more fasteners through the openings in the cover plate and engaging the fasteners cooperatively with receiving apertures in the wall box.

More specifically, the present invention is a composite electrical fitting having an electrical component and a cover plate that are integrally formed together. The electrical component comprises for exemplary purposes only, an outlet or a switch which is installed in a wall section.

Typically, the wall section has an opening cut therein to allow access to electrical wall boxes from outside of the wall. The wall box is typically secured to a selected stud within the wall via a nail or a screw. The wall box has apertures for receiving screws to retain an electrical component therein and has an opening in the rear, sides or top of wall box to permit power supply wiring comprising a group of insulated conductors to pass into the wall box. The insulated conductors comprise conductors with insulating sheaths surrounding the conductors to insulate them.

The cover plate of the composite electrical fitting comprises throughholes dimensioned to receive fasteners inserted therethrough. The electrical component comprises, preferably, a duplex outlet having wires extending therefrom, such as, for exemplary purposes only, a hot wire, a neutral wire and a ground wire. The hot wire, the neutral wire and the ground wire each have a first end and a second end. The duplex outlet further comprises an upper receptacle and a lower receptacle, both dimensioned to receive electrical plugs for lamps, appliances or similar. The upper receptacle and lower receptacle are connected in parallel so that a single set of wires exits the duplex outlet.

At that end of the wires from the electrical component, there are quick-connectors that have gripping members to secure a wire therein and/or cutting members to pierce the insulation sheath of the insulated conductors disposed therein to provide electrical communication between the conductor and the electrical component. In an alternative embodiment, the composite electrical fitting may not have quick-connectors, but, instead, is connected to power supply wires coming from the wall box via wirenuts.

To install the composite electrical fitting, the hot wire from the mains coming from the wall is inserted into a quick-connect member on the hot wire of the electrical component, the wall neutral wire is inserted into a quick-connect member on the neutral wire of the electrical component, and the wall ground wire is inserted into a quick-connect member on the ground wire of the electrical component. Subsequently, the composite electrical fitting is secured to the wall box via one or more fasteners, with the cover plate covering the wall box opening.

In an alternate embodiment, the electrical component may comprise a switch, and, in another alternate embodiment, the electrical component may comprise a quad outlet with its receptacles wired in parallel.

Accordingly, a feature and advantage of the present invention is its ability to reduce labor costs for initial installation and for retrofitting of electrical fittings.

Another feature and advantage of the present invention is its ability to reduce the number of stock keeping units for inventory purposes.

Still another feature and advantage of the present invention is its ability to be quickly installed.

Yet another feature and advantage of the present invention is its ability to be utilized with a variety of electrical components.

Yet still another feature and advantage of the present invention is that it requires only simple tools for installation.

Still yet another feature and advantage of the present invention is that it is secured via fewer fasteners that is required by typical electrical fixtures with separate cover plates.

These and other features and advantages of the present invention will become more apparent to one skilled in the art from the following description and claims when read in light of the accompanying drawings.

BRIEF DESCRIPTION OF THE SEVERAL VIEWS OF THE DRAWINGS

The present invention will be better understood by reading the Detailed Description of the Preferred and Selected Alternate Embodiments with reference to the accompanying drawing figures, in which like reference numerals denote similar structure and refer to like elements throughout, and in which.

DETAILED DESCRIPTION OF THE PREFERRED AND SELECTED ALTERNATE EMBODIMENTS OF THE INVENTION

In describing the preferred and selected alternate embodiments of the present invention, as illustrated in FIGS. 1-5, specific terminology is employed for the sake of clarity. The invention, however, is not intended to be limited to the specific terminology so selected, and it is to be understood that each specific element includes all technical equivalents that operate in a similar manner to accomplish similar functions.

Figure 1:
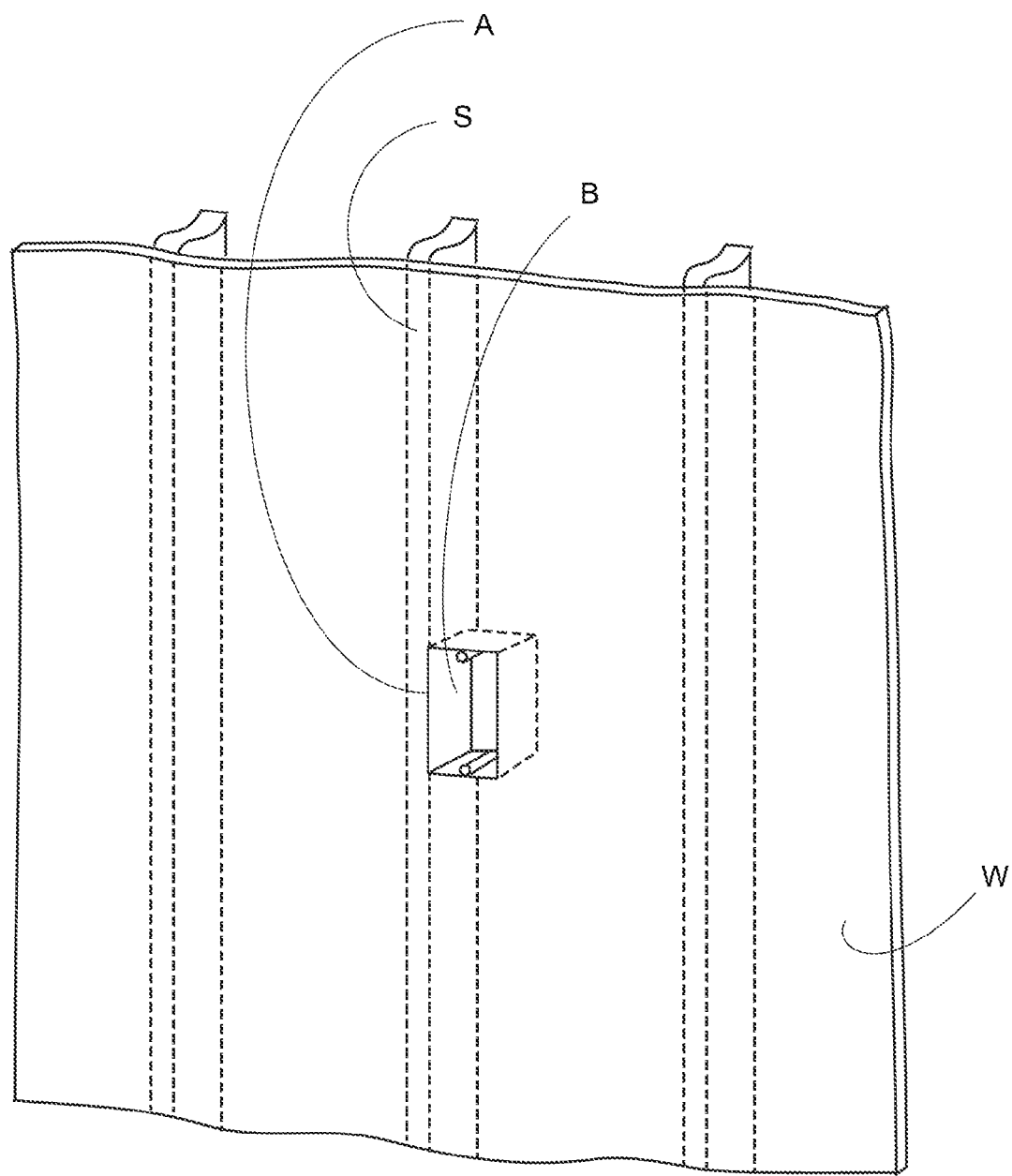
FIG. 1 is a perspective view of a wall section having an electrical wall box installed therein.
Figure 2A:
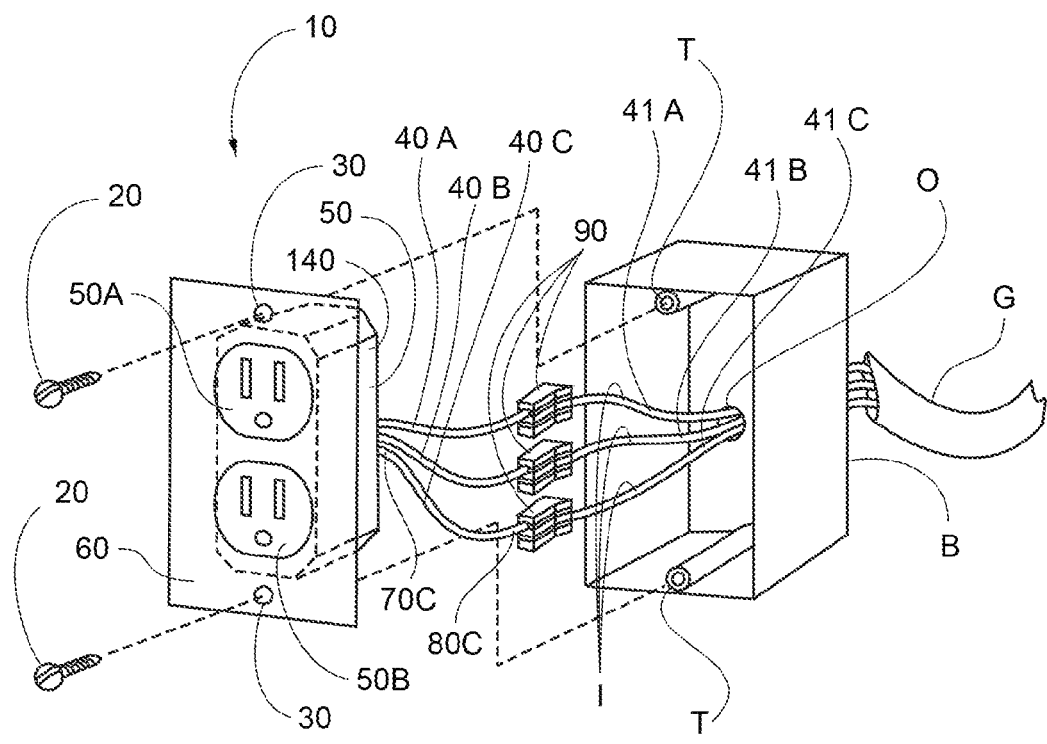
FIG. 2A is a front exploded perspective view of an electrical fitting according to a preferred embodiment, shown connected and secured to an existing electrical wall box.
Figure 3:
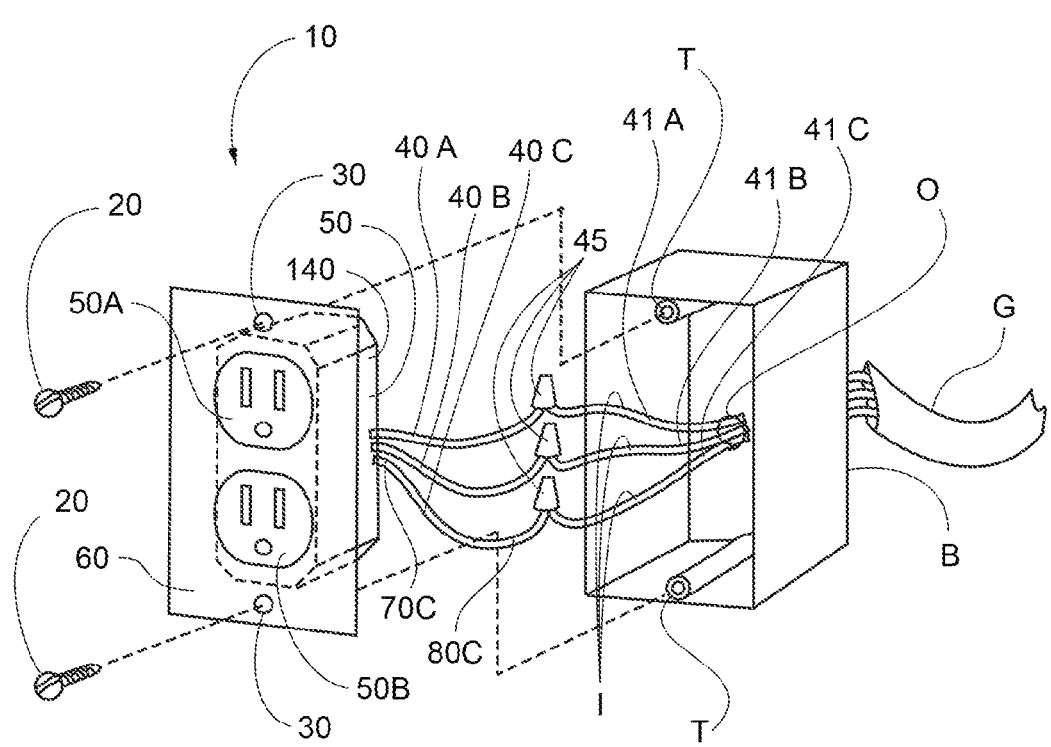
FIG. 3 is a front exploded perspective view of an electrical fitting according to a preferred embodiment, shown connected and secured to an existing electrical wall box.

Referring now to FIGS. 1-3, the present invention in a preferred embodiment comprises composite electrical fitting (best shown in FIG. 2A), wherein composite electrical fitting 10 comprises electrical component 50 and cover plate 60, wherein electrical component 50 and cover plate 60 are integrally formed.

Turning now to FIG. 1, depicted therein is wall W, having studs S therewithin. An opening A is preferably cut in wall W, wherein opening A is dimensioned to allow access to interior of wall box B from outside of wall W. Wall box W is secured to a selected stud S via fasteners as are known in the art. Wall box B comprises apertures T for receiving fasteners, such as, for exemplary purposes only, fasteners 20 discussed hereinbelow and wall box B further comprises opening O, typically in the rear of wall box B, or alternatively in a side or top of wall box B. Power supply wiring G comprises a group of insulated conductors I, wherein power supply wiring G passes through opening O in wall box B and is accessible from within wall box B (best shown in FIGS. 2C and 3). Insulated conductors I comprise conductors C and sheaths H, wherein sheaths H surround conductors C thereby insulating same.

Figure 2C:
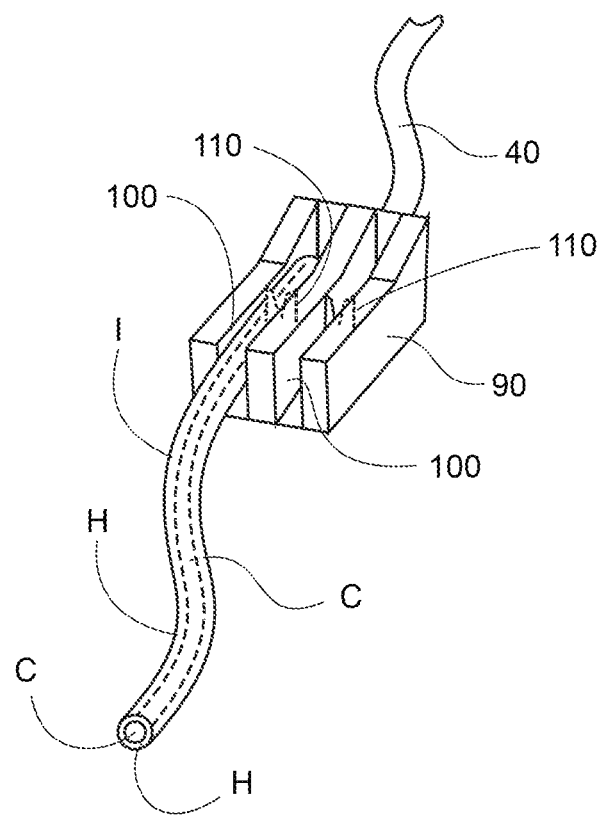
FIG. 2C is a detail perspective view of a wire from an electrical fitting according to the preferred embodiment, shown with a quick-connect used to join to another wire.
Figure 2B:
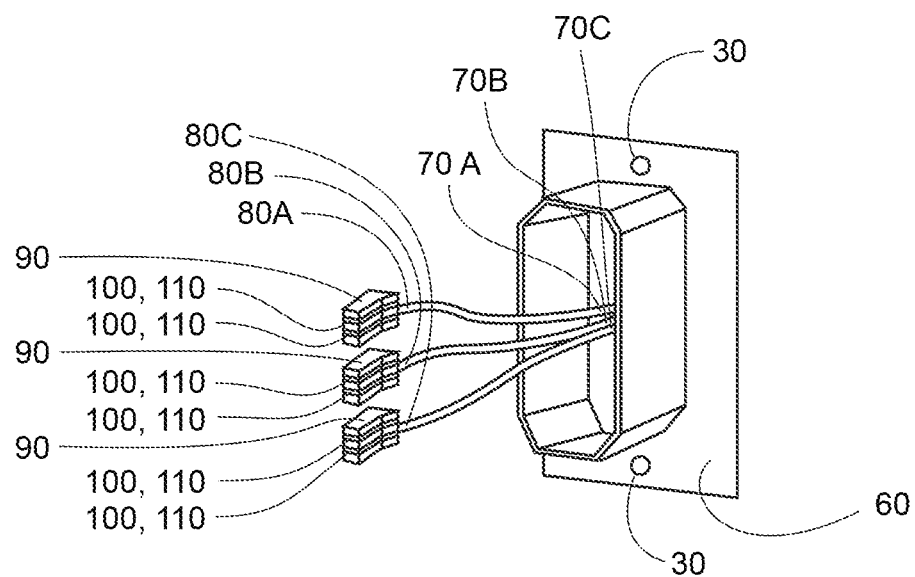
FIG. 2B is a rear perspective view of an electrical fitting according to the preferred embodiment.

Referring now to FIGS. 2A and 2B, cover plate 30 of composite electrical fitting 10 comprises throughholes 30, wherein throughholes 30 are dimensioned to receive fasteners 20 therethrough. Electrical component 50 comprises duplex outlet 140 and wires 40, wherein wires 40 comprise hot wire 40A, neutral wire 40B and ground wire 40C. Hot wire 40A comprises first end 70A and second end 80A, neutral wire 40B comprises first end 70B and second end 80B, and ground wire 40C comprises first end 70C and second end 80C. Duplex outlet 140 comprises upper receptacle 50A and lower receptacle 50B, wherein upper receptacle 50A and lower receptacle 50B are dimensioned to receive an electrical plug connected to, for exemplary purposes only, a lamp or an appliance, and wherein upper receptacle 50A and lower receptacle 50B are connected in parallel, and wherein first ends 70A, 70B and 70C are in electrical communication with upper receptacle 50A and lower receptacle 50B.

Turning now more particularly to FIG. 2C, composite electrical fitting 10 further comprises quick-connectors 90, wherein quick-connectors 90 are disposed at second ends 80A, 80B and 80C, and wherein quick-connectors 90 comprise gripping members 100 and/or cutting members 110, wherein gripping members 100 are dimensioned to grip a selected size of wire and wherein cutting members 110 are dimensioned to cut through sheath H surrounding conductor C of insulated conductor I, thereby providing electrical communication between conductor C and a selected one of second ends 80A, 80B and 80C.

In another preferred embodiment as depicted in FIG. 3, composite electrical fitting 10 does not have quick-connectors 90 installed and, instead, connection between second ends 80A, 80B, 80C and respective wall hot wire 41A, wall neutral wire 41B, and wall ground wire 41C of wiring G is made via use of wirenuts 45, as is known in the art.

To install, wall hot wire 41A comprising insulated conductor I is inserted into quick-connect member disposed at second end 80A of hot wire 40A, wall neutral wire 41B comprising insulated conductor I is inserted into quick-connect member disposed at second end 80B of neutral wire 40B, and wall ground wire 41C comprising insulated conductor I is inserted into quick-connect member 90 disposed at second end 80C of ground wire 40C. Subsequently, composite electrical fitting 10 is secured to an existing wall box B (best shown in FIG. 3), wherein electrical component 50 is dimensioned to be received within wall box B, and wherein cover plate 60 is dimensioned to cover wall box B. Fasteners 20 are inserted through throughholes 30 and engage apertures T.

Figure 4:
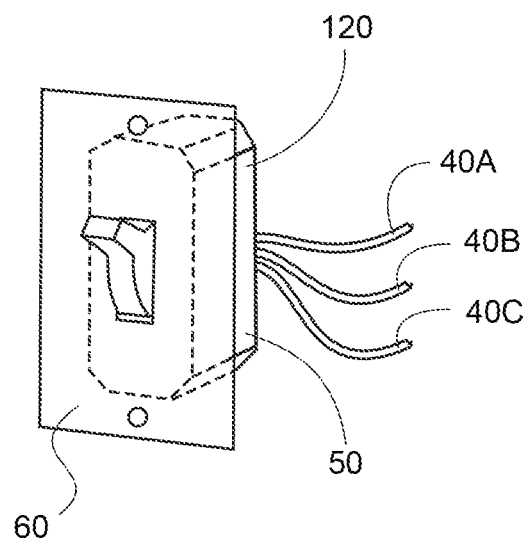
FIG. 4 is a front perspective view of an electrical fitting according to an alternate embodiment.

Referring now more specifically to FIG. 4, illustrated therein is an alternate embodiment of composite electrical fitting 10, wherein the alternate embodiment of FIG. 4 is substantially equivalent in form and function to that of the preferred embodiment detailed and illustrated in FIGS. 1-3 except as hereinafter specifically referenced. Specifically, in the embodiment of FIG. 4, electrical component 50 comprises switch 120, wherein switch 120 is substituted for duplex outlet 140, and wherein switch 120 comprises all of the components of FIGS. 2A and 2B other than duplex outlet 140.

Figure 5:
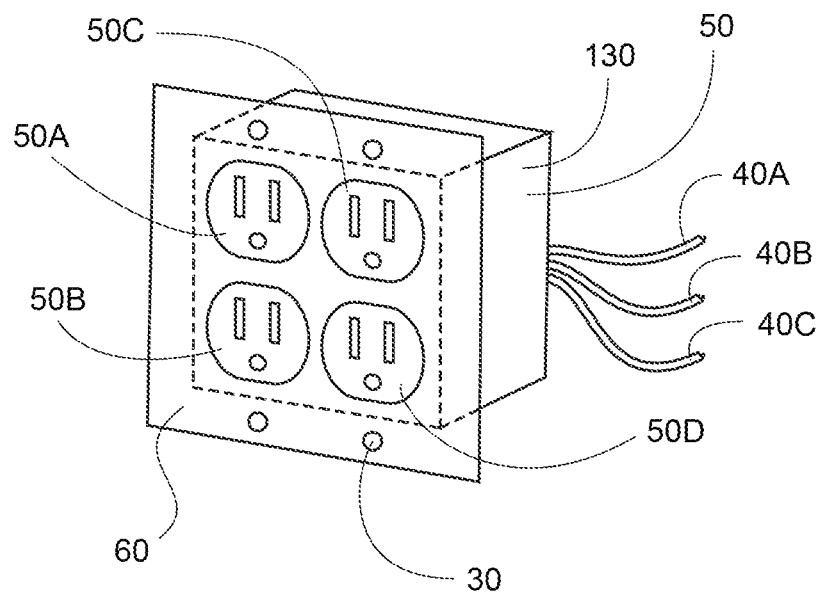
FIG. 5 is a front perspective view of an electrical fitting according to an alternate embodiment.

Referring now more specifically to FIG. 5, illustrated therein is an alternate embodiment of composite electrical fitting 10, wherein the alternate embodiment of FIG. 5 is substantially equivalent in form and function to that of the preferred embodiment detailed and illustrated in FIGS. 1-3 except as hereinafter specifically referenced. Specifically, in the embodiment of FIG. 5, electrical component 50 comprises quad outlet 120, wherein quad outlet 130 comprises upper receptacles 50A, 50C and lower receptacles 50B, 50D, and wherein receptacles 50A, 50B, 50C and 50D are wired in parallel. Other than duplex outlet 140, the alternative embodiment of FIG. 5 comprises all of the components of FIGS. 2A and 2B.

The foregoing description and drawings comprise illustrative embodiments of the present invention. Having thus described exemplary embodiments of the present invention, it should be noted by those skilled in the art that the within disclosures are exemplary only, and that various other alternatives, adaptations, and modifications may be made within the scope of the present invention. Merely listing or numbering the steps of a method in a certain order does not constitute any limitation on the order of the steps of that method. Many modifications and other embodiments of the invention will come to mind to one skilled in the art to which this invention pertains having the benefit of the teachings presented in the foregoing descriptions and the associated drawings. Although specific terms may be employed herein, they are used in a generic and descriptive sense only and not for purposes of limitation. Accordingly, the present invention is not limited to the specific embodiments illustrated herein, but is limited only by the following claims.

What is claimed is:

1. A composite electrical fitting dimensioned to be received by a new or existing wall box having an opening with power supply wiring passing therethough into the wall box, wherein said composite electrical fitting comprising:
   an electrical component having a cover therearound;
   a cover plate, integrally formed with said electrical component and said cover; and
   integral wires, each having a first end and a second end, and wherein said first end is in electrical communication with said electrical component;
   quick-connectors, where each quick-connector is for interconnecting one of said second ends of said integral wires with the corresponding power supply wiring from the wall box;
   wherein said cover plate comprises at least one throughhole therein dimensioned to receive at least one fastener, wherein the wall box comprises at least one aperture dimensioned to cooperatively engage said at least one fastener, and wherein said composite electrical fitting is removably secured to the wall box via said at least one fastener; and
   whereby, said electrical fitting being installable into the new or existing wall box via connection of said quick-connectors between said second ends of said integral wires and the power supply wires, and fastening said electrical fitting to the wall box.

2. The composite electrical fitting of claim 1, wherein each of said quick-connectors having a quick-connect member disposed at each of said second ends of said integral wires.

3. The composite electrical fitting of claim 1, wherein each of said quick-connectors having a quick-connect member disposed at each end of the power supply wiring from the wall box.

4. The composite electrical fitting of claim 1, wherein each of said quick-connectors having:
   a quick-connect member disposed at said second end of said integral wires;
   a quick-connect member disposed at an end of each of the power supply wiring from the wall box; or
   combinations thereof.

5. The composite electrical fitting of claim 1, wherein said electrical component is selected from the group consisting of electrical outlets and electrical switches.

6. The composite electrical fitting of claim 5, wherein:
   said electrical outlets comprise at least one receptacle for receiving an electrical plug; and
   said at least one receptacle comprises two receptacles or four receptacles.

7. The composite electrical fitting of claim 1 wherein said electrical fitting being installable into the new or existing wall box via connection of said quick-connectors, connection of said quick-connectors including:

connecting a quick-connector between an integral hot wire and a wall hot wire;
connecting a quick-connector between an integral neutral wire and a wall neutral wire; and
connecting a quick-connector between an integral ground wire and a wall ground wire.

8. A method of installing an electrical fitting to a new or existing electrical wall box, said method comprising the steps of:
obtaining an electrical fitting/cover plate combination, wherein said electrical fitting/cover plate combination comprises
an electrical fitting having a cover therearound,
a cover plate integrally formed together as a single unit with said electrical fitting and said cover; and
integral wires, each having a first end and a second end, and wherein said first end is in electrical communication with said electrical component;
wherein said composite electrical fitting is dimensioned to be received by the new or existing wall box,
wherein the wall box having an opening with power supply wiring passing therethough into the wall box;
quick-connectors, where each quick-connector is for interconnecting one of said second ends of said integral wires with the corresponding power supply wiring;
wherein said cover plate comprises at least one throughhole therein dimensioned to receive at least one fastener,
wherein said composite electrical fitting is removably secured to the wall box via said at least one fastener, wherein the wall box comprises at least one aperture dimensioned to cooperatively engage said at least one fastener, and
securing each of said quick-connectors between said second ends of said integral wires and the power supply wiring of the wall box; and
securing said electrical fitting/cover plate combination to the wall box including passing at least one fastener through said at least one throughhole, wherein said at least one fastener cooperatively engages the at least one aperture.

9. The method of claim 8, wherein each of said quick-connectors having a quick-connect member disposed at each of said second ends of said integral wires.

10. The method of claim 9, wherein said step of securing each of said quick-connectors between said second ends of said integral wires and the power supply wiring of the electrical wall box comprises the step of:
inserting each of the plurality of power supply wires into one of said quick-connect members, wherein each of the power supply wires is in electrical communication with one of said integral wires.

11. The method of claim 8, wherein each of said quick-connectors having a quick-connect member disposed at each end of the power supply wiring from the wall box.

12. The method of claim 11, wherein said step of securing each of said quick-connectors between said second ends of said integral wires and the power supply wiring of the wall box comprises the step of:
inserting said each of said second ends of said integral wires into one of said quick-connect members, wherein each of the power supply wires is in electrical communication with one of said integral wires.

13. The method of claim 8, wherein each of said quick-connectors having:

a quick-connect member disposed at each of said second ends of said integral wires;
a quick-connect member disposed at each end of the power supply wiring from said wall box; or
combinations thereof.

14. The method of claim 8, wherein said step of obtaining an electrical fitting/cover plate combination further comprises the step of:
obtaining an electrical fitting/cover plate combination comprising a switch; or
obtaining a multiple outlet electrical fitting/cover plate combination.

15. The method of claim 8, wherein said step of securing each of said quick-connectors between said second ends of said integral wires and the power supply wiring of the electrical wall box including:
connecting a quick-connector between an integral hot wire and a wall hot wire;
connecting a quick-connector between an integral neutral wire and a wall neutral wire; and
connecting a quick-connector between an integral ground wire and a wall ground wire.

16. A multi-outlet electrical fitting dimensioned to be received by a new or existing wall box having an opening with power supply wiring passing therethough into the wall box, wherein said multi-outlet electrical fitting comprising:
an electrical fitting having a plurality of outlets and a cover therearound,
a cover plate integrally formed with said electrical fitting and said cover; and
integral wires, each having a first end and a second end, and wherein said first end is in electrical communication with said electrical fitting;
quick-connectors, where each quick-connector is for interconnecting one of said second ends of said integral wires with the corresponding power supply wiring;
wherein said cover plate comprises at least one throughhole therein dimensioned to receive at least one fastener, wherein the wall box comprises at least one aperture dimensioned to cooperatively engage said at least one fastener, and wherein said multi-outlet electrical fitting is removably secured to the wall box via said at least one fastener; and
whereby, said electrical fitting being installable into the new or existing wall box via connection of said quick-connectors between said second ends of said integral wires and the power supply wires, and fastening said electrical fitting to the wall box.

17. The multi-outlet electrical fitting of claim 16, wherein each of said quick-connectors having a quick-connect member disposed at each of said second ends of said integral wires.

18. The multi-outlet electrical fitting of claim 16, wherein each of said quick-connectors having a quick-connect member disposed at each end of the power supply wiring from the wall box.

19. The multi-outlet electrical fitting of claim 16, wherein each of said quick-connectors having:
a quick-connect member disposed at said second end of said integral wires;
a quick-connect member disposed at an end of each of the power supply wiring from the wall box; or
combinations thereof.

20. The multi-outlet electrical fitting of claim 16 wherein said multi-outlet electrical fitting being installable into the new or existing wall box via connection of said quick-connectors, connection of said quick-connectors including:

connecting a quick-connector between an integral hot wire and a wall hot wire;
connecting a quick-connector between an integral neutral wire and a wall neutral wire; and
connecting a quick-connector between an integral ground wire and a wall ground wire.

\* \* \* \* \*